(12) United States Patent
Tsai

(10) Patent No.: US 9,257,998 B2
(45) Date of Patent: Feb. 9, 2016

(54) PHASE LOCKED LOOP

(71) Applicant: Taiwan Semiconductor Manufacturing Co., LTD., Hsinchu (TW)

(72) Inventor: Tsung-Hsien Tsai, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 72 days.

(21) Appl. No.: 14/050,691

(22) Filed: Oct. 10, 2013

(65) Prior Publication Data

US 2015/0102845 A1 Apr. 16, 2015

(51) Int. Cl.
*H03L 7/093* (2006.01)

(52) U.S. Cl.
CPC ..................... *H03L 7/093* (2013.01)

(58) Field of Classification Search
CPC ......................................................... H03L 7/093
See application file for complete search history.

(56) References Cited

U.S. PATENT DOCUMENTS

| 7,825,739 | B2 * | 11/2010 | Higashino | 331/17 |
| 8,217,696 | B2 * | 7/2012 | August et al. | 327/159 |
| 8,284,816 | B1 * | 10/2012 | Clementi | 375/130 |
| 8,344,769 | B2 * | 1/2013 | Adachi | 327/156 |
| 8,508,303 | B2 * | 8/2013 | Maeda | 331/1 A |

* cited by examiner

*Primary Examiner* — Patrick O'Neill
(74) *Attorney, Agent, or Firm* — Maschoff Brennan

(57) ABSTRACT

A circuit includes a phase locked loop and a logic IC. The phase locked loop is coupled to the logic IC. The logic IC is configured for generating an adaptive residue according to a first parameter and a second parameter. The phase locked loop is configured for providing the first parameter and the second parameter, and the phase locked loop generates an oscillator signal based on the adaptive residue.

17 Claims, 5 Drawing Sheets

PHASE LOCKED LOOP

BACKGROUND

A phase locked loop includes at least a phase detector and a digitally-controlled oscillator (DCO). The phase detector compares a reference value with an output signal of the DCO to generate a residue value, and then the DCO generates output signals with phase jitters according to the residue value.

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
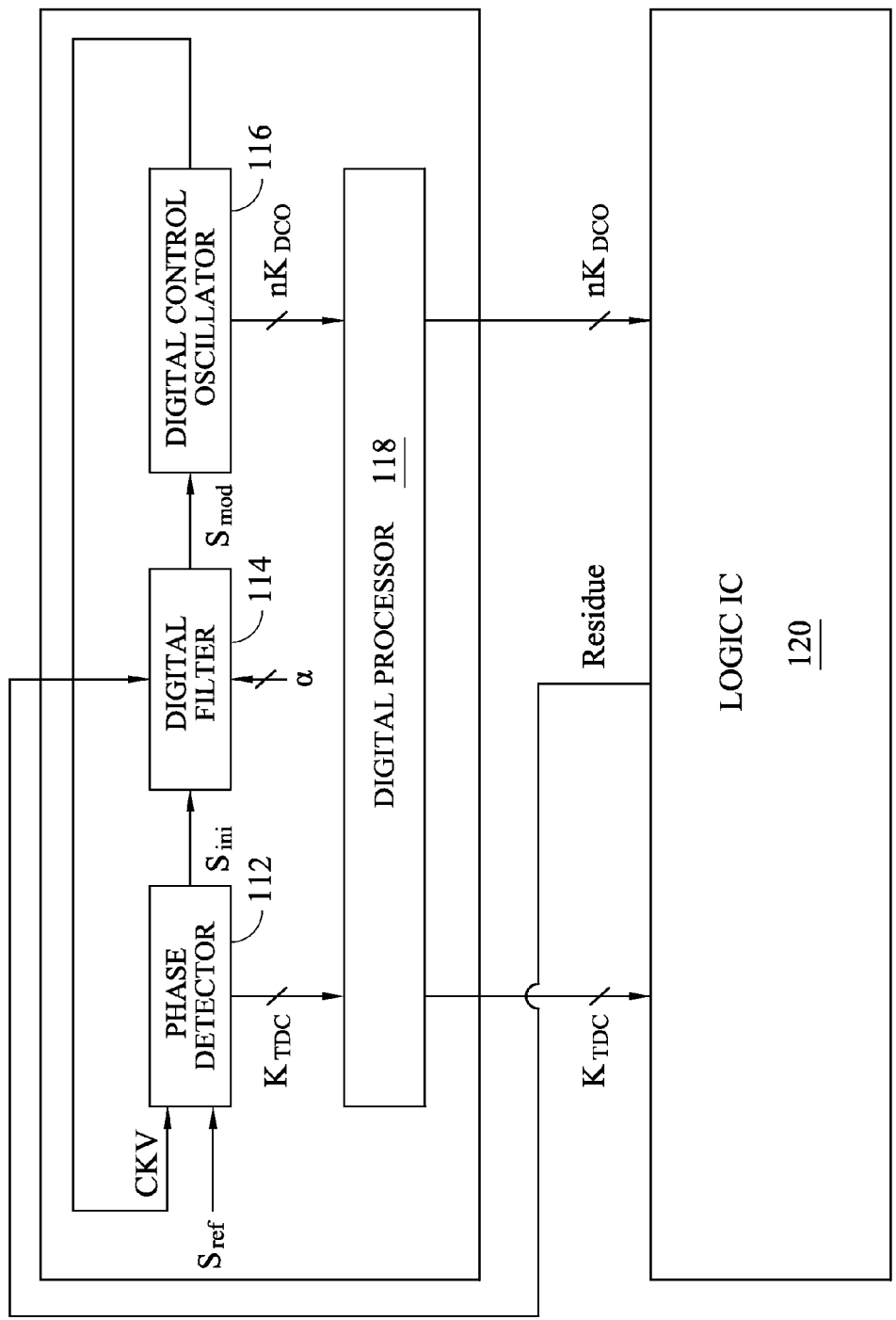
FIG. 1 is a schematic diagram of a phase locked loop in accordance with some embodiments of the present disclosure.

FIG. 1 is a schematic diagram of a phase locked loop (PLL) 100 in accordance with some embodiments of the present disclosure.

The phase locked loop 100 includes a phase detector 112, a digital filter 114, a digitally-controlled oscillator (DCO) 116, a digital processor 118, and a logic IC (integrated circuit) 120. In some embodiments, the phase locked loop 100 is an all digital phase locked loop (ADPLL).

The phase detector 112 is electrically coupled to the DCO 116, and is configured for receiving an initial oscillator signal CKV generated from the DCO 116. Furthermore, the phase detector 112 receives a reference signal $S_{ref}$, and is configured for comparing the initial oscillator signal CKV with the reference signal $S_{ref}$ to generate a phase difference between the oscillator signal CKV and the reference signal $S_{ref}$. The phase detector 112 generates an initial residue signal $S_{ini}$ based on the phase difference. In some embodiments, the phase detector 112 is a time-to-digital converter (TDC).

The digital filter 114 is electrically coupled to the phase detector 112, and is configured for receiving the initial residue signal $S_{ini}$. In some approaches, the digital filter 114 is configured for filtering the initial residue signal to generate a filtered initial residue signal $S_{ini}$. Compared to the approaches, in the embodiments illustrated in FIG. 1, the digital filter 114 is configured for modifying the initial residue signal based on an adaptive residue to generate a modified residue signal $S_{mod}$. In various embodiments, the digital filter 114 is configured for modifying the initial residue signal $S_{ini}$ based on the adaptive residue and a parameter α of the digital filter 114 to generate the modified residue signal $S_{mod}$.

The DCO 116 is electrically coupled to the digital filter 114, and is configured for generating a modified oscillator signal CKV with a phase jitter lower than a predetermined value base on the modified residue signal $S_{mod}$.

As illustratively shown in FIG. 1, the phase detector 112 is electrically coupled to the digital processor 118, and is configured for transmitting information related to the phase detector 112 to the digital processor 118. Explained in a different way, the digital processor 118 is configured for gathering information from the phase detector 112, and thus generates a parameter $K_{TDC}$ in accordance with information gathered from the phase detector 112.

The phase detector 112 electrically coupled to the digital processor 118 is given for illustrative purposes. In some embodiments, the phase detector 112 is electrically coupled to the logic IC 120 without the digital processor 118, and is configured for transmitting information related to the phase detector 112 to the logic IC 120.

The DCO 116 is electrically coupled to the digital processor 118, and is configured for transmitting information related to the DCO 116 to the digital processor 118. Explained in a different way, the digital processor 118 is configured for gathering information from the DCO 116, and thus generates a parameter $nK_{DCO}$ in accordance with the information gathered from the DCO 116.

The DCO 116 electrically coupled to the digital processor 118 is for illustrative purposes. In some embodiments, the DCO 116 is electrically coupled to the logic IC 120 without the digital processor 118, and is configured for transmitting information related to the DCO 116 to the logic IC 120.

Various connections of the phase detector 112 and the DCO 116 are within the contemplated scope of the present disclosure.

The logic IC 120 is configured for receiving the parameter $K_{TDC}$ and the parameter $nK_{DCO}$. The logic IC 120 calculates the parameter $K_{TDC}$ and the parameter $nK_{DCO}$ to generate the adaptive residue. In some embodiments, the logic IC 120 is electrically coupled to the phase detector 112 and the DCO 116, and is configured for receiving information related to the phase detector 112 and the DCO 116 to calculate the aforementioned information. The logic IC 120 generates the adaptive residue based on the aforementioned information, and the adaptive residue is transmitted to the digital filter 114.

Figure 2:
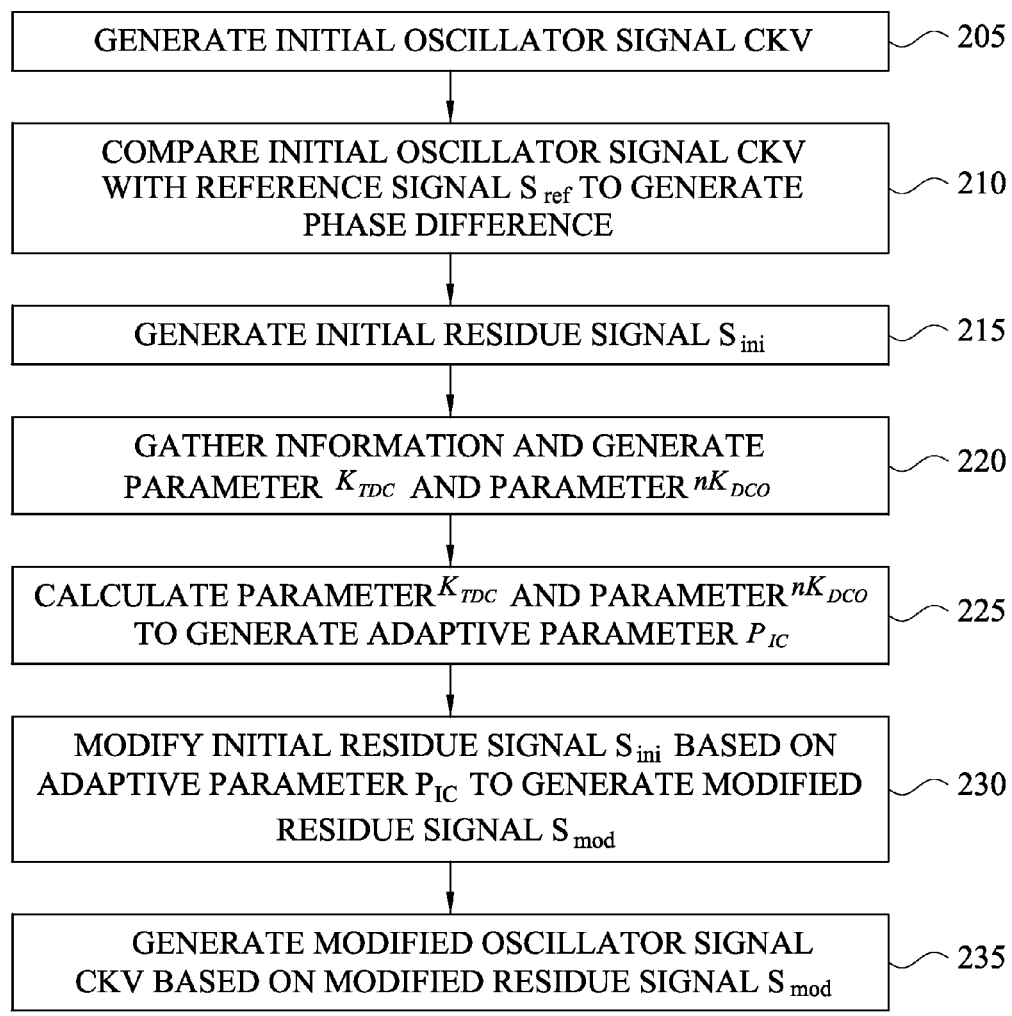
FIG. 2 is a flow chart of a method illustrating operations of the phase locked loop in FIG. 1, in accordance with some embodiments of the present disclosure.

FIG. 2 is a flow chart of a method 200 illustrating operations of the phase locked loop 100 in FIG. 1, in accordance with some embodiments of the present disclosure. For illustration, the operations of the phase locked loop 100 in FIG. 1 are described with reference to the method 200.

In operation 205, the DCO 116 generates an initial oscillator signal CKV.

In operation 210, the phase detector 112 compares the initial oscillator signal CKV with the reference signal $S_{ref}$ to generate the phase difference between the initial oscillator signal CKV and the reference signal $S_{ref}$.

After the comparison, in operation 215, the phase detector 112 generates an initial residue signal $S_{ini}$ based on the phase difference.

In operation 220, the digital processor 118 gathers information from the phase detector 112 and the DCO 116 to respectively generate the parameter $K_{TDC}$ and the parameter $nK_{DCO}$. In some embodiments, the parameter $K_{TDC}$ is related to a period of the phase detector 112 and a period of the DCO 116. For illustration, the parameter $K_{TDC}$ is determined as follows:

$$K_{TDC} = \frac{\Delta T_{TDC,res}}{T_V},$$

where $\Delta T_{TDC,res}$ is the period of the phase detector 112, and $T_V$ is the period of the DCO 116.

In some embodiments, the parameter $nK_{DCO}$ is related to a frequency of the DCO 116 and a frequency of the reference signal $S_{ref}$. For illustration, the parameter $nK_{DCO}$ is determined as follows:

$$nK_{DCO} = \frac{f_R}{\Delta f_{V,res}},$$

where $f_R$ is the frequency of the reference signal $S_{ref}$, and $\Delta f_{V,res}$ is the frequency of the DCO 116.

In operation 225, the logic IC 120 calculates the parameter $K_{TDC}$ and the parameter $nK_{DCO}$, and thus generates the adaptive residue. For illustration, the adaptive residue is determined as follows:

$$\text{Residue} = K_{TDC} \times 2^{BIT_{fraction}} \times (INV_{number} + \phi),$$

and $$\phi = \text{ABS}\left[1 - \frac{1}{nK_{DCO} \times 2 \times \alpha}\right],$$

where Residue is the adaptive residue, $BIT_{fraction}$ is a bit number utilized by the phase locked loop 100, $INV_{number}$ is a residue value generated from an inverter (not labeled) of the phase detector 112, and $\alpha$ is a parameter of the digital filter 114. For further illustration, the phase detector 112 includes a plurality of inverters (not labeled), and $INV_{number}$ is a residue value generated from one of those inverters.

In operation 230, the digital filter 114 modifies the initial residue signal $S_{ini}$ based on the adaptive residue to generate the modified residue signal $S_{mod}$.

In operation 235, the DCO 116 generates the modified oscillator signal CKV with the phase jitter having a value lower than a predetermined value, based on the modified residue signal $S_{mod}$. In some embodiments, the predetermined value is 2.05 ps. In various embodiments, the predetermined value is 1.95 ps. The aforementioned predetermined values are given for illustrative purposes. Various predetermined values are within the contemplated scope of the present disclosure.

Figure 3:
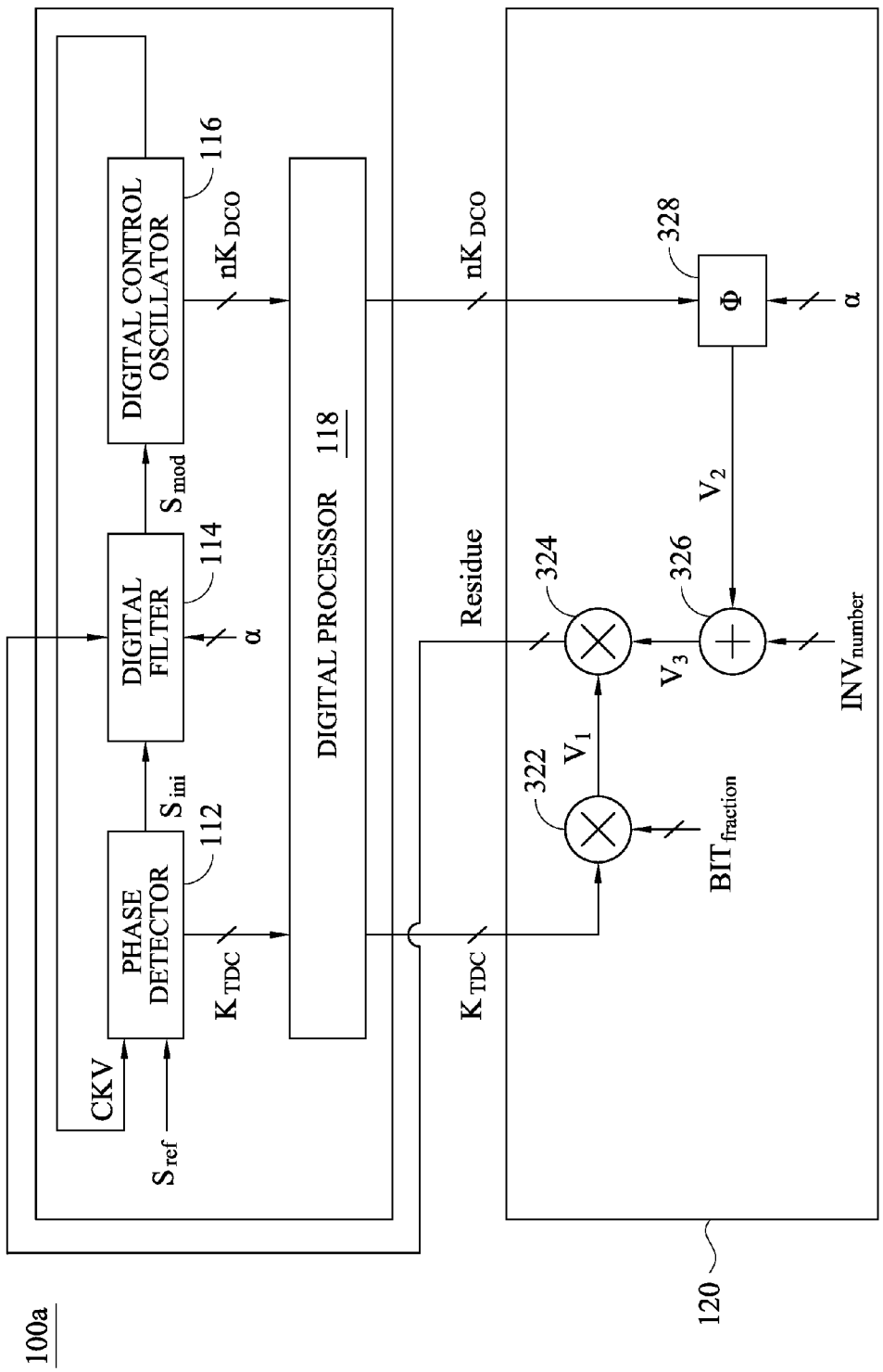
FIG. 3 is a schematic diagram of a phase locked loop in accordance with some embodiments of the present disclosure.

FIG. 3 is a schematic diagram of a phase locked loop 100a in accordance with some embodiments of the present disclosure.

Compared to FIG. 1, in the phase locked loop 100a in FIG. 3, the logic IC 120 of the phase locked loop 100a includes a multiplier 322, a multiplier 324, an adder 326, and a calculation logic gate 328.

As illustratively shown in FIG. 3, the multiplier 322 is electrically coupled to the digital processor 118, and is configured for receiving the parameter $K_{TDC}$. The multiplier 322 is further configured for receiving the bit number $BIT_{fraction}$ utilized by the phase locked loop 100a, and thus multiplies the parameter $K_{TDC}$ and the bit number $BIT_{fraction}$ to generate a calculated value $V_1$.

The multiplier 322 electrically couple to the digital processor 118 is given for illustrative purposes. In some embodiments, the multiplier 322 is electrically coupled to the phase detector 112 without the digital processor 118, and is configured for receiving information related to the phase detector 112. The multiplier 322 generates the calculated value $V_1$ in accordance with the information related to the phase detector 112 and the bit number $BIT_{fraction}$.

The calculation logic gate 328 is electrically coupled to the digital processor 118, and is configured for receiving the parameter $nK_{DCO}$. The calculation logic gate 328 is further configured for receiving the parameter $\alpha$ of the digital filter 114, and then the calculation logic gate 328 calculates the parameter $nK_{DCO}$ and the parameter $\alpha$ of the digital filter 114 to generate a calculated value $V_2$.

The calculation logic gate 328 electrically coupled to the digital processor 118 is given for illustrative purposes. In some embodiments, the calculation logic gate 328 is electrically coupled to the DCO 116 without the digital processor 118, and is configured for receiving information related to the DCO 116. The calculation logic gate 328 generates the calculated value $V_2$ in accordance with the information related to the DCO 116 and the parameter $\alpha$ of the digital filter 114. Various connections of the multiplier 322 and the calculation logic gate 328 are within the contemplated scope of the present disclosure.

An adder 326 is electrically coupled to the calculation logic gate 328, and is configured for receiving the calculated value $V_2$. The adder 326 is further configured for receiving a residue value $INV_{number}$ generated from an inverter (not labeled) of the phase detector 112, and thus adds the calculated value $V_2$ and the residue value $INV_{number}$ to generate a calculated value $V_3$. For illustration, the phase detector 112 includes a plurality of inverters (not labeled), and the residue value $INV_{number}$ is a residue value generated from one of those inverters.

The multiplier 324 is electrically coupled to the multiplier 322 and the adder 326, and is configured for receiving the calculated value $V_1$ and the calculated value $V_3$. The multiplier 324 then multiplies the calculated value $V_1$ and the calculated value $V_3$ to generate the adaptive residue.

The digital filter 314 is electrically coupled to the multiplier 324, and is configured for receiving the adaptive residue.

Figure 4:
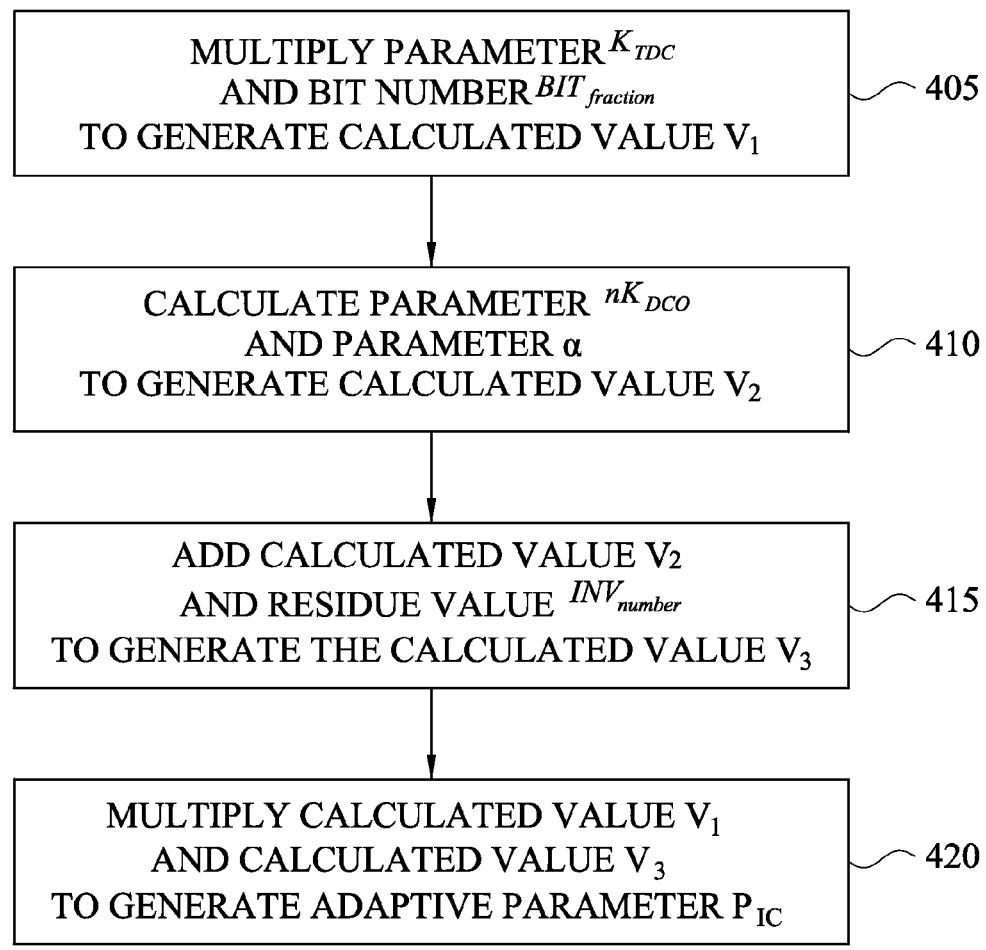
FIG. 4 is a flow chart of a method illustrating operations of the phase locked loop in FIG. 3, in accordance with some embodiments of the present disclosure.

FIG. 4 is a flow chart of a method 400 illustrating operations of the phase locked loop 100a in FIG. 3, in accordance with some embodiments of the present disclosure.

In operation 405, the multiplier 322 receives the parameter $K_{TDC}$ and the bit number $BIT_{fraction}$ utilized by the phase locked loop 100a, and then the multiplier 322 multiplies the parameter $K_{TDC}$ and the bit number $BIT_{fraction}$ to generate the calculated value $V_1$.

In operation 410, the calculation logic gate 328 receives the parameter $nK_{DCO}$ and the parameter $\alpha$ of the digital filter 114. Subsequently, the calculation logic gate 328 calculates the parameter $nK_{DCO}$ and the parameter $\alpha$ of the digital filter 114 to generate the calculated value $V_2$.

In operation 415, the adder 326 receives the calculated value $V_2$ and the residue value $INV_{number}$ generated from an inverter (not labeled) of the phase detector 112, and then the adder 326 adds the calculated value $V_2$ and the residue value $INV_{number}$ to generate the calculated value $V_3$.

In operation 420, the multiplier 324 receives the calculated value $V_1$ and the calculated value $V_3$, and thus multiplies the calculated value $V_1$ and the calculated value $V_3$ to generate the adaptive residue.

Figure 5:
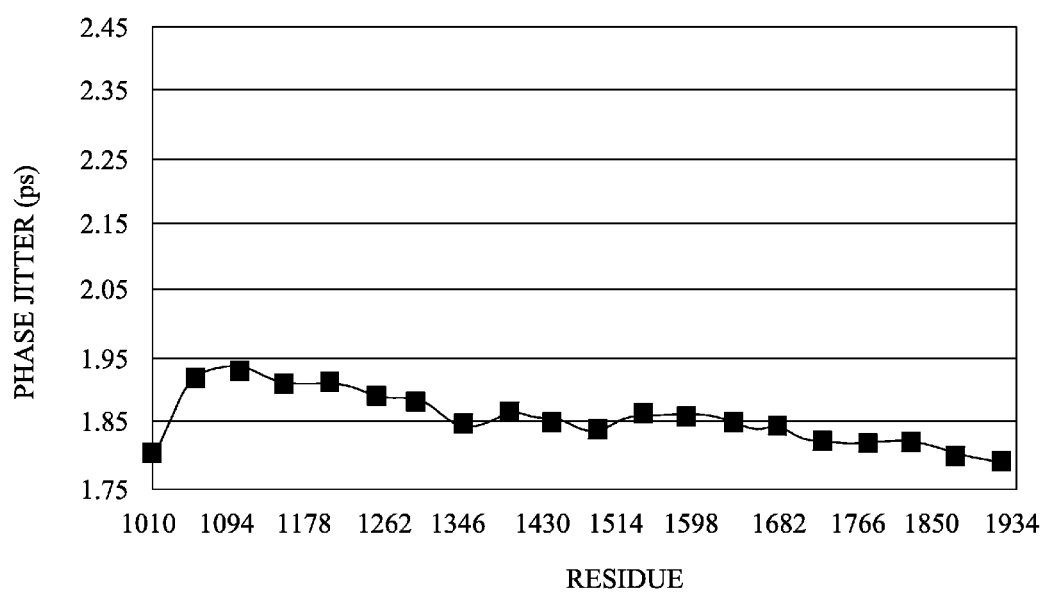
FIG. 5 is a phase jitter chart illustrating a relation between phase jitters of the modified oscillator signals and residue values.

Based on the aforementioned embodiments, the phase jitter of the modified oscillator signal CKV generated by the DCO 116 is lower than the predetermined value. Reference is made to FIG. 5, which is a phase jitter chart illustrating the relation between phase jitters of the modified oscillator signals CKV and the residue values. The experimental data are described below: the frequency $\Delta f_{V,res}$ of the DCO 116 is 1.075 MHz, the period $\Delta T_{TDC,res}$ of the phase detector 112 is 7.8 ps, the period $T_V$ of the DCO 116 is 333.33 ps, the frequency $f_R$ of the reference signal $S_{ref}$ is 100 MHz, the bit number $BIT_{fraction}$ utilized by the phase locked loop 100, 100a is 11, and the parameter $\alpha$ of the digital filter 114 is $2^{-2}$. The experimental data are given for illustrative purposes. Various experimental data are within the contemplated scope of the present disclosure.

In some approaches, parts of the output signals of the DCO and the reference signal cannot be compared appropriately by the phase detector, so the residue values generated by the phase detector indicates wrong phase information. As a result, the phase jitters of the output signals generated by the DCO, based on the residue values with wrong phase information, are unpredictable.

Compared to the aforementioned approaches, the phase locked loop 100, 100a gathers and calculates information inside the phase locked loop 100, 100a to generate the adaptive residue which indicates appropriate phase information. Accordingly, even if the initial residue signal $S_{ini}$ reports wrong phase information, when the initial residue signal $S_{ini}$ is modified by the digital filter 114 based on the adaptive residue indicating appropriate phase information, the phase jitters of the output signals generated by the DCO 116, based on the modified residue signal $S_{mod}$, are predictable.

With reference to FIG. 5, all of the phase jitters of the output signals generated by the DCO 116 are lower than 2.05 ps. In some embodiments, all of the phase jitters of the output signals generated by the DCO 116 are lower than 1.95 ps.

Since all of the phase jitters of the output signals generated by the DCO 116 are lower than a predictable value, there is no need to scan all of the residue values to get a phase jitter chart. Accordingly, the phase locked loop 100, 100a is efficient and decreases costs.

In some embodiments, a circuit is disclosed that includes a phase locked loop and a logic IC. The phase locked loop is configured for generating a first oscillator signal based on an initial residue signal and gathering information inside the phase locked loop to generate a first parameter and a second parameter. The logic IC is configured for calculating the first parameter and the second parameter to generate an adaptive residue. The phase locked loop is configured for modifying the initial residue signal based on the adaptive residue to generate a modified residue signal, such that the phase locked loop is configured for generating a second oscillator signal with a phase jitter lower than a predetermined value based on the modified residue signal.

Also disclosed is a circuit that includes a digital control oscillator, a phase detector, and a digital filter. The digital control oscillator is configured for generating a first oscillator signal based on an initial residue signal. The phase detector is configured for comparing the first oscillator signal with a reference signal to generate the initial residue signal. The digital filter is configured for filtering and modifying the initial residue signal based on an adaptive residue related to a first parameter and a second parameter to generate a modified residue signal, wherein the first parameter is generated according to the phase detector, and the second parameter is generated according to the digital control oscillator. The digital control oscillator is configured for generating a second oscillator signal with a phase jitter lower than a predetermined value base on the modified residue signal.

Also disclosed is a method that includes the steps outlined below. A first oscillator signal is generated based on an initial residue signal. The first oscillator signal is compared with a reference signal to generate the initial residue signal. The initial residue signal is filtered and modified based on an adaptive residue related to a first parameter and a second parameter to generate a modified residue signal, wherein the first parameter is generated according to a phase detector of a phase locked loop, and the second parameter is generated according to a digital control oscillator of the phase locked loop. A second oscillator signal with a phase jitter lower than a predetermined value is generated base on the modified residue signal.

The above illustrations include exemplary operations, but the operations are not necessarily performed in the order shown. Operations may be added, replaced, changed order, and/or eliminated as appropriate, in accordance with the spirit and scope of various embodiments of the present disclosure.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:
1. A circuit, comprising:
a phase locked loop comprising a phase detector, a digital filter, and a digital control oscillator, the phase locked loop configured for providing a first parameter being related to a period of the phase detector and a period of the digital control oscillator and a second parameter being related to a frequency of the digital control oscil- lator and a frequency of a reference signal, the phase locked loop generating an oscillator signal based on an adaptive residue; and a logic integrated circuit (IC) coupled to the phase locked loop and configured for using the first parameter, a bit number utilized by the phase locked loop, the second parameter, and a residue generated from an inverter of the phase detector, to generate the adaptive residue.

2. The circuit according to claim 1, wherein
the digital filter is coupled to the phase detector, and
the digital control oscillator is coupled to the digital filter.

3. The circuit according to claim 2, wherein the first parameter and the second parameter are determined as follows:

$$K_{TDC} = \frac{\Delta T_{TDC,res}}{T_V},$$

and $$nK_{DCO} = \frac{f_R}{\Delta f_V},$$

where $K_{TDC}$ is the first parameter, $\Delta T_{TDC,res}$ is the period of the phase detector, $T_V$ is the period of the digital control oscillator, $nK_{DCO}$ is the second parameter, $f_R$ is the frequency of the reference signal, and $\Delta f_V$ is the frequency of the digital control oscillator.

4. The circuit according to claim 3, wherein the logic IC comprises:

a first multiplier coupled to the phase detector, the first multiplier configured for multiplying the first parameter and the bit number utilized by the phase locked loop to generate a first calculated value;

a calculation logic gate coupled to the digital control oscillator, the calculation logic gate configured for using the second parameter and a third parameter generated according to the digital filter to generate a second calculated value;

an adder coupled to the calculation logic gate, the adder configured for adding the second calculated value and the residue generated from the inverter of the phase detector to generate a third calculated value; and a second multiplier coupled to the first multiplier and the adder, the second multiplier configured for multiplying the first calculated value and the third calculated value to generate the adaptive residue.

5. The circuit according to claim 4, wherein the adaptive residue is determined as follows:

$$\text{Residue} = K_{TDC} \times 2^{BIT_{fraction}} \times (INV_{number} + \phi),$$

and $$\phi = \text{ABS}\left[1 - \frac{1}{nK_{DCO} \times 2 \times \alpha}\right],$$

where Residue is the adaptive residue, $BIT_{fraction}$ is the bit number utilized by the phase locked loop, $INV_{number}$ is the residue generated from the inverter of the phase detector, and $\alpha$ is a parameter of the digital filter.

6. A circuit, comprising:
a digital control oscillator configured for generating a first oscillator signal based on an initial residue signal;
a phase detector coupled to the digital control oscillator, the phase detector configured for comparing the first oscillator signal with a reference signal to generate the initial residue signal; and a digital filter coupled to the phase detector, the digital filter configured for modifying the initial residue signal based on an adaptive residue related to a first parameter, a second parameter, a bit number and a residue, to generate a modified residue signal, wherein the first parameter is related to a period of the phase detector and a period of the digital control oscillator, the bit number is utilized by a phase locked loop comprising the digital control oscillator, the phase detector and the digital filter, the second parameter is related to a frequency of the digital control oscillator and a frequency of a reference signal, and the residue is generated from an inverter of the phase detector, wherein the digital control oscillator is configured for generating a second oscillator signal base on the modified residue signal.

7. The circuit according to claim 6, wherein the first parameter is determined as follows:

$$K_{TDC} = \frac{\Delta T_{TDC,res}}{T_V},$$

where $K_{TDC}$ is the first parameter, $\Delta T_{TDC,res}$ is the period of the phase detector, and $T_V$ is the period of the digital control oscillator.

8. The circuit according to claim 6, wherein the second parameter is determined as follows:

$$nK_{DCO} = \frac{f_R}{\Delta f_V},$$

where $nK_{DCO}$ is the second parameter, $f_R$ is the frequency of the reference signal, and $\Delta f_V$ is the frequency of the digital control oscillator.

9. The circuit according to claim 6, further comprising:
a digital processor coupled to the phase detector and the digital control oscillator, the digital processor configured for gathering information from the digital control oscillator and the phase detector to generate the first parameter and the second parameter.

10. The circuit according to claim 9, further comprising:
a logic IC coupled to the digital filter and the digital processor, the logic IC configured for using the first parameter and the second parameter to generate the adaptive residue.

11. The circuit according to claim 10, wherein the logic IC comprises:

a first multiplier coupled to the digital processor, the first multiplier configured for multiplying the first parameter and the bit number utilized by the phase locked loop to generate a first calculated value;

a calculation logic gate coupled to the digital processor, the calculation logic gate configured for using the second parameter and a third parameter generated according to the digital filter to generate a second calculated value;

an adder coupled to the calculation logic gate, the adder configured for adding the second calculated value and the residue generated from the inverter of the phase detector to generate a third calculated value; and a second multiplier coupled to the first multiplier and the adder, the second multiplier configured for multiplying the first calculated value and the third calculated value to generate the adaptive residue.

12. The circuit according to claim 6, wherein the adaptive residue is determined as follows:

$$\text{Residue} = K_{TDC} \times 2^{BIT_{fraction}} \times (INV_{number} + \phi),$$

and $$\phi = \text{ABS}\left[1 - \frac{1}{nK_{DCO} \times 2 \times \alpha}\right],$$

where Residue is the adaptive residue, $K_{TDC}$ is the first parameter, $BIT_{fraction}$ is the bit number utilized by the phase locked loop, $INV_{number}$ is the residue generated from the inverter of the phase detector, $nK^{DCO}$ is the second parameter, and $\alpha$ is a parameter of the digital filter.

13. A method, comprising:
generating a first oscillator signal based on an initial residue signal;
comparing the first oscillator signal with a reference signal to generate the initial residue signal;
modifying the initial residue signal based on an adaptive residue related to a first parameter, a second parameter, a bit number and a residue, to generate a modified residue signal, wherein the first parameter is related to a period of a phase detector and a period of a digital control oscillator, the bit number is utilized by a phase locked loop comprising the digital control oscillator and the phase detector, the second parameter is related to a frequency of the digital control oscillator and a frequency of a reference signal, and the residue is generated from an inverter of the phase detector; and
generating a second oscillator signal base on the modified residue signal.

14. The method according to claim 13, further comprising:
generating the first parameter based on the period of the phase detector and the period of the digital control oscillator.

15. The method according to claim 13, further comprising:
generating the second parameter based on the frequency of the digital control oscillator and the frequency of the reference signal.

16. The method according to claim 13, further comprising:
generating the adaptive residue based on the first parameter and the second parameter.

17. The method according to claim 16, wherein the step of generating the adaptive residue based on the first parameter and the second parameter comprises:
multiplying the first parameter and the bit number utilized by the phase locked loop to generate a first calculated value;
generating a second calculated value based on the second parameter and a third parameter generated according to a digital filter;
adding the second calculated value and the residue generated from the inverter of the phase detector to generate a third calculated value; and
multiplying the first calculated value and the third calculated value to generate the adaptive residue.

* * * * *